(12) United States Patent
Bang et al.

(10) Patent No.: US 7,364,442 B2
(45) Date of Patent: Apr. 29, 2008

(54) FIXING STRUCTURE OF CIRCUIT BOARD AND DISPLAY MODULE COMPRISING THE SAME

(75) Inventors: Won-Kyu Bang, Suwon-si (KR); Myoung-Kon Kim, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/783,182

(22) Filed: Apr. 6, 2007

(65) Prior Publication Data

US 2007/0249224 A1 Oct. 25, 2007

(30) Foreign Application Priority Data

Apr. 20, 2006 (KR) .................... 10-2006-0035747

(51) Int. Cl.
*H01R 4/66* (2006.01)
(52) U.S. Cl. .................... 439/92; 439/97; 439/947; 439/564; 439/545; 411/522
(58) Field of Classification Search .................. 439/92, 439/97, 947, 545, 564, 72, 74, 75; 174/138 D, 174/138 G; 411/522
See application file for complete search history.

(56) References Cited

U.S. PATENT DOCUMENTS

| | | | | |
|---|---|---|---|---|
| 3,279,518 A | * | 10/1966 | Bollinger | 411/166 |
| 5,707,241 A | * | 1/1998 | Hamlin et al. | 439/67 |
| 5,716,226 A | * | 2/1998 | Takahashi et al. | 439/329 |
| 6,140,591 A | * | 10/2000 | Osborne et al. | 174/138 E |
| 6,171,141 B1 | * | 1/2001 | Yasui et al. | 439/545 |
| 6,210,215 B1 | * | 4/2001 | Hwang | 439/545 |
| 6,305,870 B1 | * | 10/2001 | Mita et al. | 403/254 |
| 6,377,445 B1 | * | 4/2002 | Davis et al. | 361/683 |
| 6,621,002 B1 | * | 9/2003 | Ennis et al. | 174/557 |
| 6,695,629 B1 | * | 2/2004 | Mayer | 439/92 |
| 6,799,980 B2 | * | 10/2004 | Bloomfield et al. | 439/92 |
| 6,865,091 B2 | * | 3/2005 | Hsu | 361/801 |
| 7,028,389 B2 | * | 4/2006 | Chang | 29/739 |
| 7,212,400 B2 | * | 5/2007 | Fan et al. | 361/684 |
| 2005/0078446 A1 | * | 4/2005 | Bae | 361/687 |

* cited by examiner

*Primary Examiner*—Tho D. Ta
(74) *Attorney, Agent, or Firm*—Lee & Morse, P.C.

(57) ABSTRACT

A fixing structure for a circuit board includes at least one board mounting hole in the circuit board, the board mounting hole having a guide hole and an insertion hole, and at least one board mounting member inserted through the board mounting hole, the board mounting member having a main body, a cover, and an insertion portion therebetween, wherein the insertion portion has a cross-sectional area smaller than either of the main body or the cover and is capable of fitting in the insertion hole of the board mounting hole.

18 Claims, 6 Drawing Sheets

FIXING STRUCTURE OF CIRCUIT BOARD AND DISPLAY MODULE COMPRISING THE SAME

BACKGROUND OF THE INVENTION

1. Field of the Invention

The present invention relates to a fixing structure of a circuit board and a plasma display module including the same. More particularly, the present invention relates to a fixing structure capable of securing a circuit board to a chassis base of a plasma display module at a predetermined uniform distance.

2. Description of the Related Art

In general, various kinds of circuit boards may be employed in a plasma display module. In particular, at least one conventional circuit board may be mounted on a chassis base of a plasma display module to supply electric power to the plasma display module and to control electric signal transmission within the plasma display module.

The conventional circuit board may be attached to the chassis base by at least one screw coupled to a boss. More particularly, the circuit board may include a hole aligned with a boss of a chassis base, so a screw may be coupled to the boss through the hole of the circuit board.

The conventional boss may have a flat upper surface, so that the circuit board may be mounted on an upper surface of the boss. Additionally, especially when the circuit board is formed of an opaque material, the boss may include a step, i.e., a protruding support structure surrounding the boss, to facilitate location of the boss, alignment of the boss with a circuit board hole, and attachment of the circuit board to the chassis base via the boss.

However, manufacturing a boss with a step may require additional manufacturing processes, thereby increasing manufacturing costs. Further, movement of the circuit board above the boss in order to facilitate exact fit between the circuit board hole and the boss step may increase processing time.

Accordingly, there exists a need for an improved configuration of a chassis base and a circuit board capable of facilitating alignment and attachment between a hole of the circuit board and a boss of the chassis base.

SUMMARY OF THE INVENTION

The present invention is therefore directed to a fixing structure and a plasma display module, which substantially overcome one or more of the disadvantages of the related art.

It is therefore a feature of an embodiment of the present invention to provide a fixing structure for a circuit board capable of efficiently aligning and securing a hole of a circuit board with a boss.

It is another feature of an embodiment of the present invention to provide a plasma display apparatus having a fixing structure capable of efficiently aligning and securing a hole of a circuit board with a boss.

According to an aspect of the present invention, there is provided a fixing structure for a circuit board, including at least one board mounting hole in the circuit board, the board mounting hole having a guide hole and an insertion hole; and at least one board mounting member inserted through the board mounting hole, the board mounting member having a main body, a cover, and an insertion portion therebetween, wherein the insertion portion has a cross-sectional area smaller than either of the main body or the cover and capable of fitting in the insertion hole of the board mounting hole. The insertion portion may have a thickness substantially equal to a thickness of the circuit board.

The board mounting hole may include a grounding terminal. The guide hole may have a cross-sectional area larger than that of the cover of the board mounting member. The insertion hole may include a support portion having a radius substantially equal to a radius of the insertion portion.

The fixing structure may further include a plurality of board mounting holes. The board mounting holes may be along one edge of the circuit board. The board mounting holes may be U-shaped and in communication with an exterior.

In another aspect of the present invention, there is provided a plasma display apparatus, including a plasma display panel, a chassis base attached to a rear surface of the plasma display panel, at least one circuit board having at least one board mounting hole, the board mounting hole including an insertion hole and a guide hole, at least one board mounting member coupled between the chassis base and the circuit board, the board mounting member having a main body, a cover, and an insertion portion, wherein the insertion portion has a cross-sectional area smaller than a cross-sectional area of either the main body or the cover and is capable of fitting in the insertion hole of the board mounting hole, and a circuit unit.

The board mounting hole may include a grounding terminal electrically connected to the chassis base through the board mounting member. The guide hole may have a cross-sectional area larger than that of the cover of the board mounting member. The insertion portion may have a thickness substantially equal to a thickness of the circuit board. The insertion hole may include a support portion having a radius substantially equal to a radius of the insertion portion.

The plasma display apparatus may further include at least two board mounting holes along a single edge of the circuit board. Additionally, the plasma display apparatus may include at least one boss hole in an opposite edge of the circuit board with respect to the board mounting holes, at least one boss protruding to a height substantially equal to a height of the main body, and at least one boss screw coupled to the boss through the boss hole.

In yet another aspect of the present invention, there is provided a plasma display apparatus including a plasma display panel, a chassis base attached to a rear surface of the plasma display panel, a circuit unit including a plurality of circuit boards, each circuit board including a plurality of U-shaped board mounting holes and boss holes, each board mounting hole including an insertion hole and a guide hole, a plurality of board mounting members, each board mounting member coupled between the chassis base and a circuit board, the board mounting member having a main body, a cover, and an insertion portion, wherein the insertion portion has a cross-sectional area smaller than a cross-sectional area of either the main body or the cover and is capable of fitting in the insertion hole of the board mounting hole, a plurality of bosses protruding in the chassis base, and a plurality of boss screws coupled to the bosses through the boss holes.

Each of the board mounting holes may include a grounding terminal electrically connected to the chassis base through the board mounting member. The insertion portion may have a thickness substantially equal to a thickness of the circuit board. The board mounting hole may include an inner portion and an outer portion, so that the inner portion may have a width that is the same as that of the outer portion or smaller. The boss may protrude to a height substantially equal to a height of the main body of the board mounting member.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
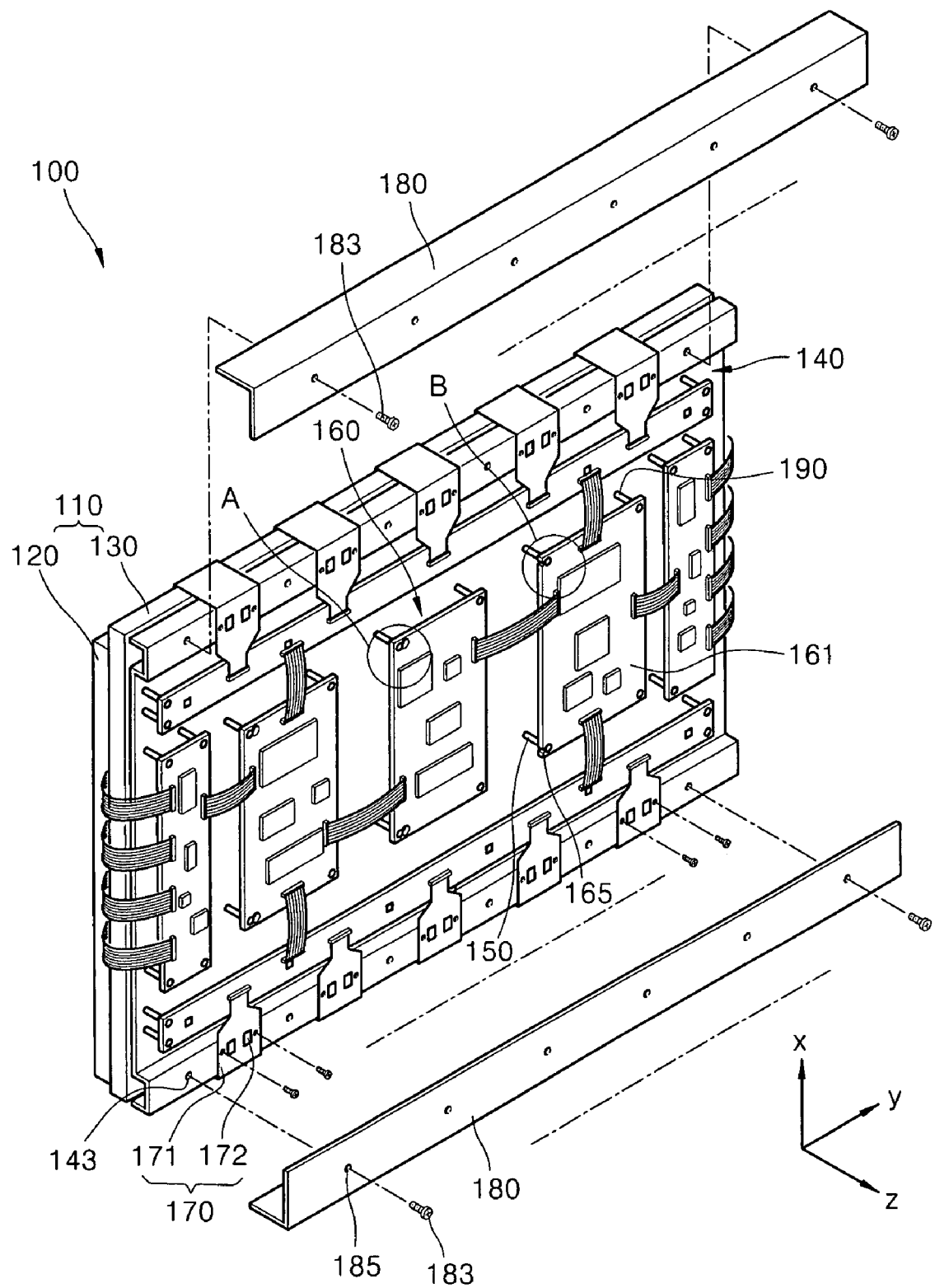
FIG. 1 illustrates a schematic perspective view of a plasma display apparatus having fixing structures according to embodiments of the present invention.

Korean Patent Application No. 10-2006-0035747, filed on Apr. 20, 2006, in the Korean Intellectual Property Office, and entitled: "Fixing Structure of Circuit Board and Display Apparatus Comprising the Same," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of elements and regions may be exaggerated for clarity of illustration. It will also be understood that when a layer or element is referred to as being "on" another layer, element or substrate, it can be directly on the other element or substrate, or intervening elements may also be present. Further, it will be understood that when an element is referred to as being "under" another layer, it can be directly under, or one or more intervening elements may also be present. In addition, it will also be understood that when an element is referred to as being "between" two elements, it can be the only element between the two elements, or one or more intervening elements may also be present. Like reference numerals refer to like elements throughout.

Figure 2:
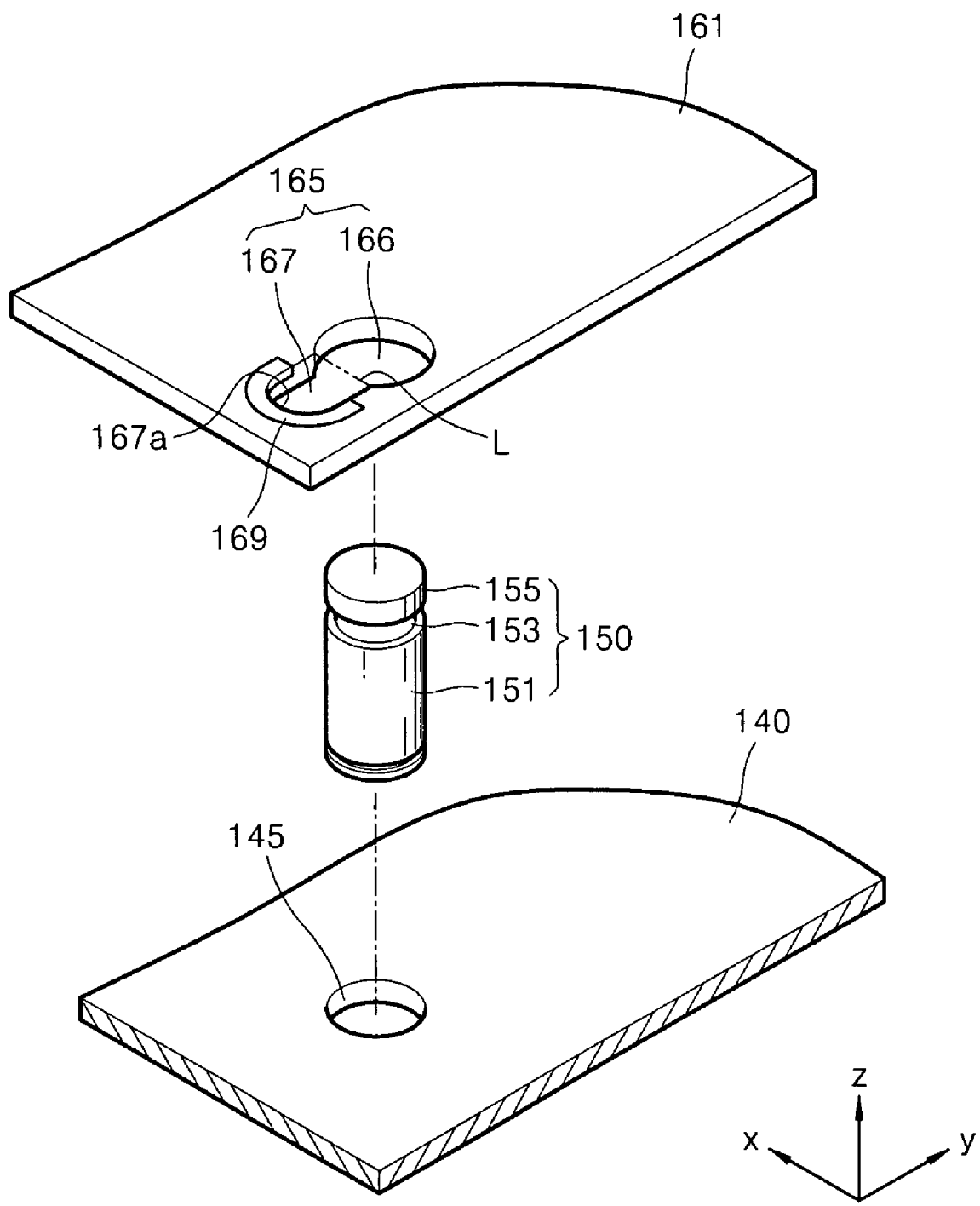
FIG. 2 illustrates an exploded perspective view of part A in FIG. 1.

An exemplary embodiment of a fixing structure in a plasma display module according to the present invention will be described more fully with reference to FIGS. 1-2. As illustrated in FIGS. 1-2, a fixing structure according to an embodiment of the present invention may include at least one board mounting member 150 coupled between a chassis base 140 and a circuit board 161 of a plasma display module 100.

As illustrated in FIG. 2, the board mounting member 150 may include a main body 151, an insertion portion 153, and a cover 155. The main body 151 may be in communication with the chassis base 140 and have a longitudinal structure positioned along a z-axis between the chassis base 140 and the circuit board 161. The main body 151 may have a thickness, i.e., a distance as measured along the z-axis, of about 6 mm or larger in order to satisfy a safety standard, e.g., UL standard. The insertion portion 153 of the board mounting member 150 may extend from the main body 151 along the z-axis and have a cross-sectional area that is smaller than the cross sectional area of the main body 151. The cover 155 of the board mounting member 150 may extend from the insertion portion 153 along the z-axis and have a cross-sectional area that is larger than the cross-sectional area of the insertion portion 153. Therefore, the insertion portion 153 may be positioned between the main body 151 and the cover 155 and concavely depressed therebetween, as illustrated in FIG. 2, due to its smaller cross-section.

The chassis base 140 may be positioned on a rear surface of a PDP 110 for support, and it may include a mounting member hole 145 therethrough, such that the main body 151 of the mounting member 150 may be coupled to the chassis base 140 through the mounting member hole 145. However, other connection means between the mounting member 150 and the chassis base 140 are not excluded from the scope of the present invention.

The circuit board 161 may be mounted on a rear surface of the chassis base 140 and connected thereto via at least one mounting member 150, such that a distance between the circuit board 161 and the chassis base 140 may be at least about 6 mm in order to satisfy safety standards, e.g., a UL standard. The circuit board 161 may include at least one board mounting hole 165 having a cross-sectional area that is larger that the cross-sectional area of the cover 155 of the board mounting member 150. In particular, the board mounting hole 165 may include a guide hole 166 and an insertion hole 167 in communication with one another. The guide hole 166 may have a larger radius that a radius of the cover 155, while the radius of the cover 155 may be larger than a radius of the insertion hole 167. Accordingly, the cover 155 of the board mounting member 150 may be inserted through the guide hole 166, i.e., along the z-axis, to be positioned directly above the guide hole 166, such that the insertion portion 153 of the board mounting member 150 may be centered in the guide hole 166 and slid, i.e., along the y-axis, toward the insertion hole 167 to be positioned therein. The insertion portion 153 may have a thickness, i.e., a distance as measured along the z-axis, that is substantially equal to a thickness of the circuit board 161, and therefore, upon positioning of the insertion portion 153 in the insertion hole 167 of the circuit board 161 and the cover 155 thereabove, the board mounting member 150 may be firmly secured to the circuit board 161, as will be discussed in more detail below with respect to FIGS. 3A-4D.

A virtual line L between the insertion hole portion 167 and the guide hole portion 166, as illustrated in FIG. 2, may be longer than a diameter of the insertion portion 153, thereby facilitating sliding of the insertion portion 153 from the guide hole 166 into the insertion hole portion 167. In addition, the insertion hole 167 may include a support portion 167a having a same radius as a radius of the insertion portion 153, so that the insertion portion 153 may be inserted therein.

The circuit board 161 may include a plurality of board mounting holes 165, such that a respective number of board mounting members 150 may be employed to support the circuit board 161. The circuit board 161 may include one board mounting hole 165 in each corner of the circuit board 161. Alternatively, the circuit board 161 may include a plurality of board mounting holes 165, e.g., two, along one edge of a circuit board 161, as illustrated in FIGS. 1 and 3A.

Figure 3A:
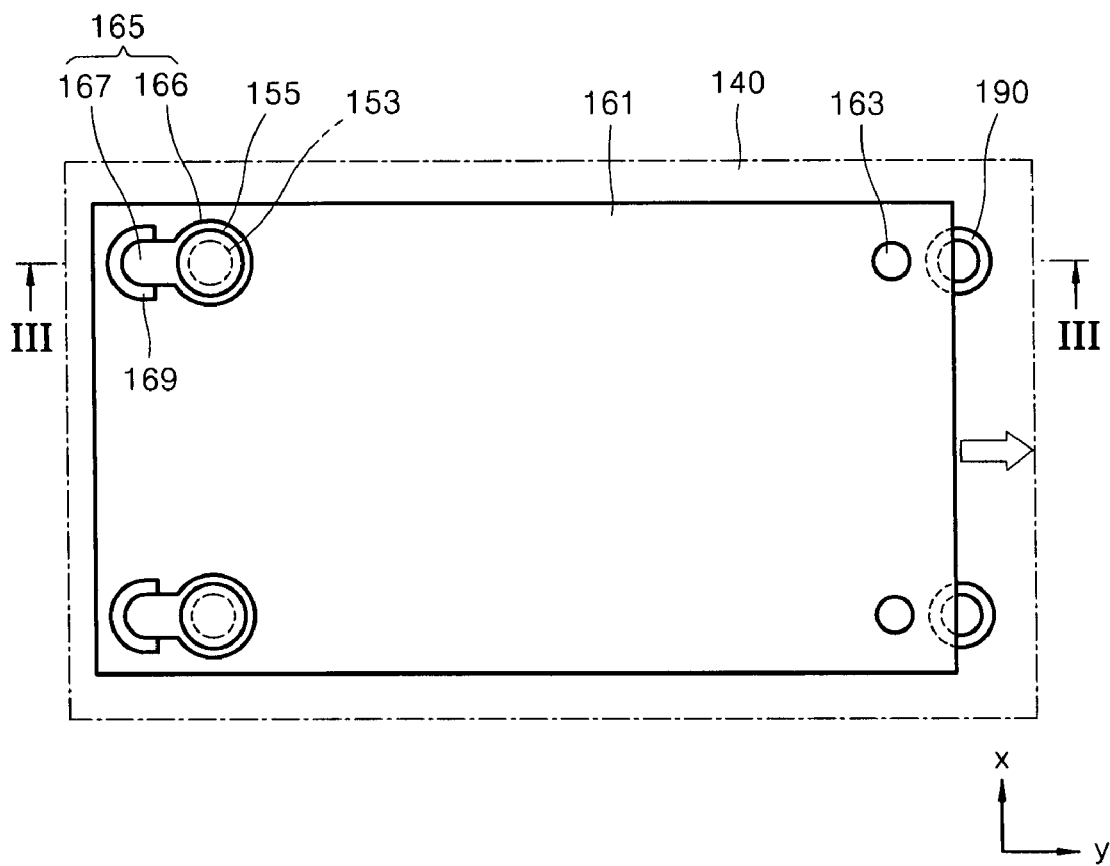
FIGS. 3A-3B illustrate plan and cross-sectional views, respectively, of a board mounting member in a guide hole of a circuit board illustrated in FIG. 2.

In this respect, it should be noted that when the board mounting holes 165 are formed along one edge of the circuit board 161, a corresponding number of boss holes 163 may be formed along an opposite edge of the circuit board 161, as further illustrated in FIG. 3A.

The board mounting hole 165 of the circuit board 161 may further include a grounding terminal 169 electrically connected to the chassis base 140 through the board mounting member 150 in order to facilitate grounding of a circuit (not shown) formed on the circuit board 161. Alternatively, the grounding terminal 169 may be formed on the boss hole 163 of the circuit board 161 to be electrically connected to the chassis base 140 through the boss 190.

According to an embodiment of the present invention, a method of fixing the circuit board 161 will be described with reference to FIGS. 3A through 4B. It should be noted, however, that for the purpose of illustration only the board mounting member 150 and the board mounting hole 165 are described as positioned along one edge of the circuit board 161, while the boss 190 and the boss hole 193 are described as positioned along an opposite edge of the circuit board 161 with respect to the board mounting member 150 and the board mounting hole 165. However, other configurations of board mounting members 150, board mounting holes 165, bosses 190, and boss holes 193 are not excluded from the scope of the present invention.

Figure 3B:
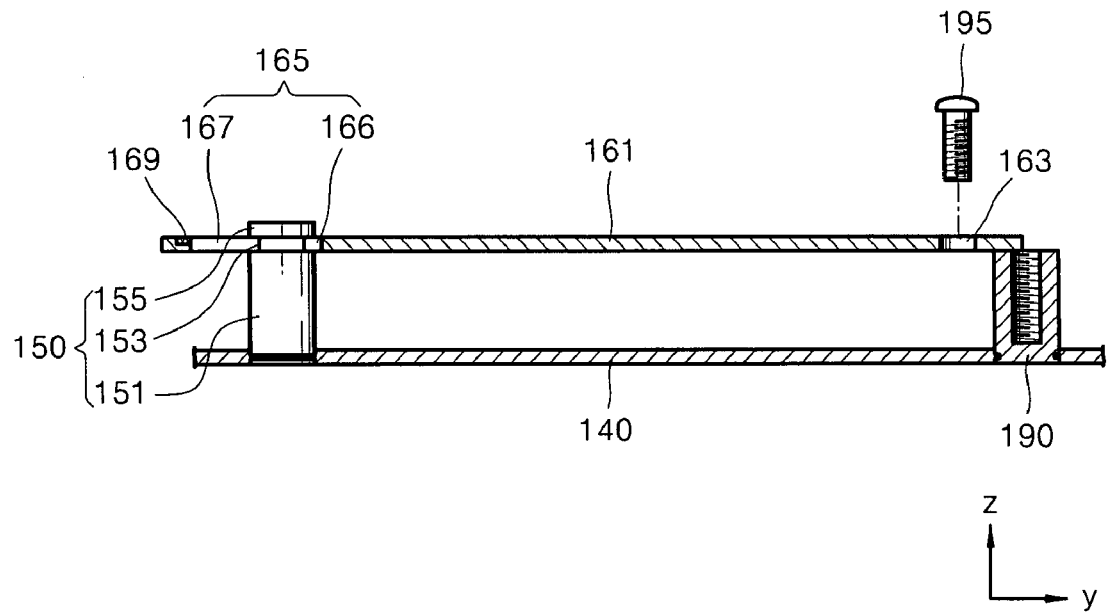

First, the circuit board 161 may be mounted on at least one boss and one board mounting member 150, i.e., the board mounting member 150 may be inserted through the guide hole 166 of the board mounting hole 165, so that the cover 155 may protrude along the z-axis away from the circuit board 161 and the insertion portion 153 may be centered in the guide hole 166, as illustrated in FIGS. 3A-3B. The board mounting member 150 and the boss 190 may be positioned at opposite edges of the circuit board 161 to provide sufficient support thereto. Further, a height of the boss 190 may be substantially the same as a height of the main body 151 of the board mounting member 150, and therefore, the circuit board 161 may be positioned parallel to the chassis base 140.

Figure 4A:
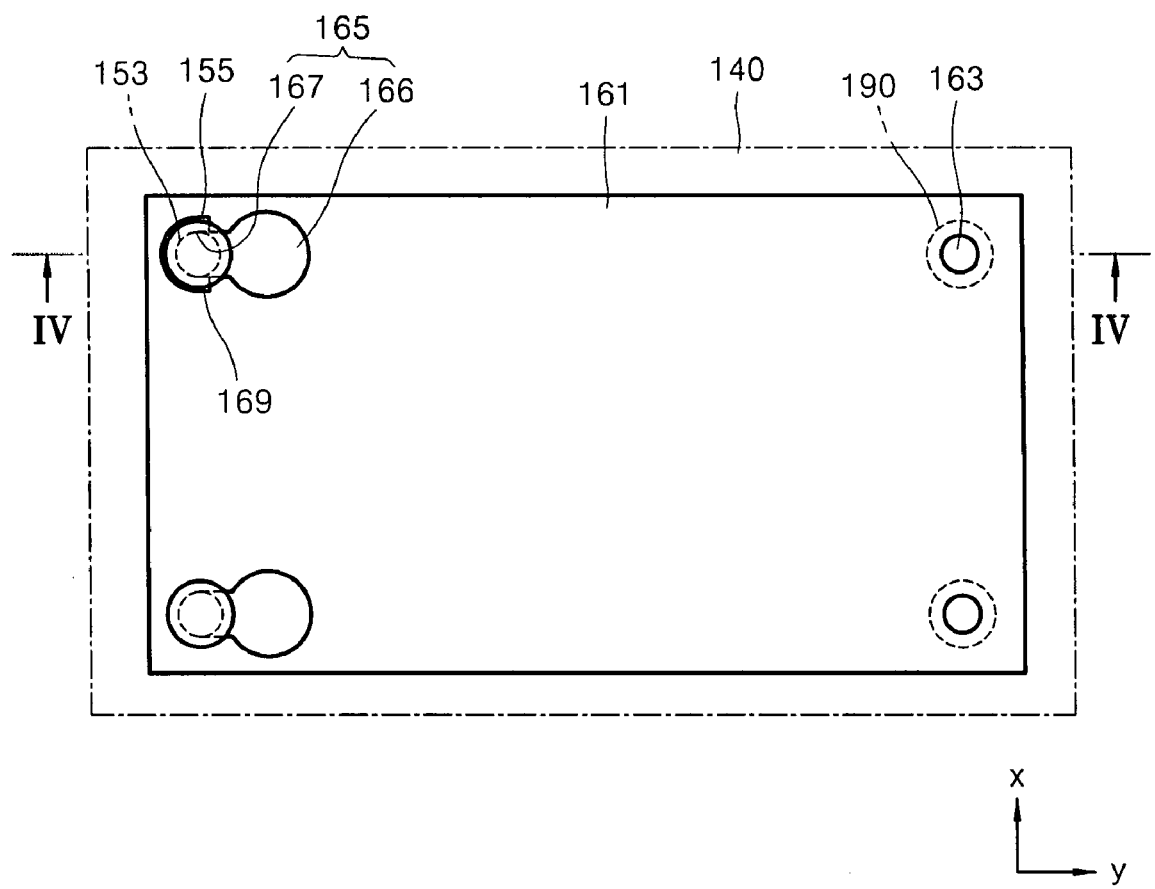
FIGS. 4A-4B illustrate plan and cross-sectional views, respectively, of the board mounting member in an insertion hole of the circuit board illustrated in FIGS. 3A-3B.
Figure 4B:
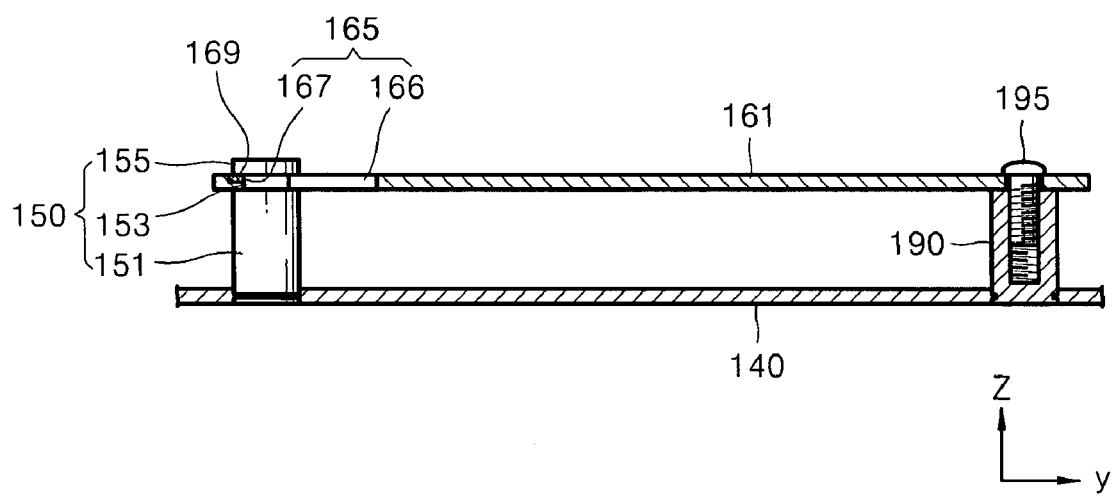

Next, the circuit board 161 may be moved along the y-axis, as illustrated in FIGS. 3A-3B, in order to slide the insertion portion 153 from the center of the guide hole 166 into the insertion hole 167, so that the insertion portion 153 may fit securely into the insertion hole 167. The configuration of the board mounting member 150 and the boss 190 according to an embodiment of the present invention may provide that upon sliding and inserting of the insertion portion 153 into the insertion hole 167, the boss hole 163 formed on an opposite edge of the circuit board 161, i.e., with respect to the board mounting hole 165, may align with the boss 190, thereby facilitating insertion of a screw 195 through the boss hole 163 of the circuit board 161 into the boss 190 to complete attachment of the circuit board 161 to the chassis base 140, as illustrated in FIGS. 4A-4B.

Figure 5:
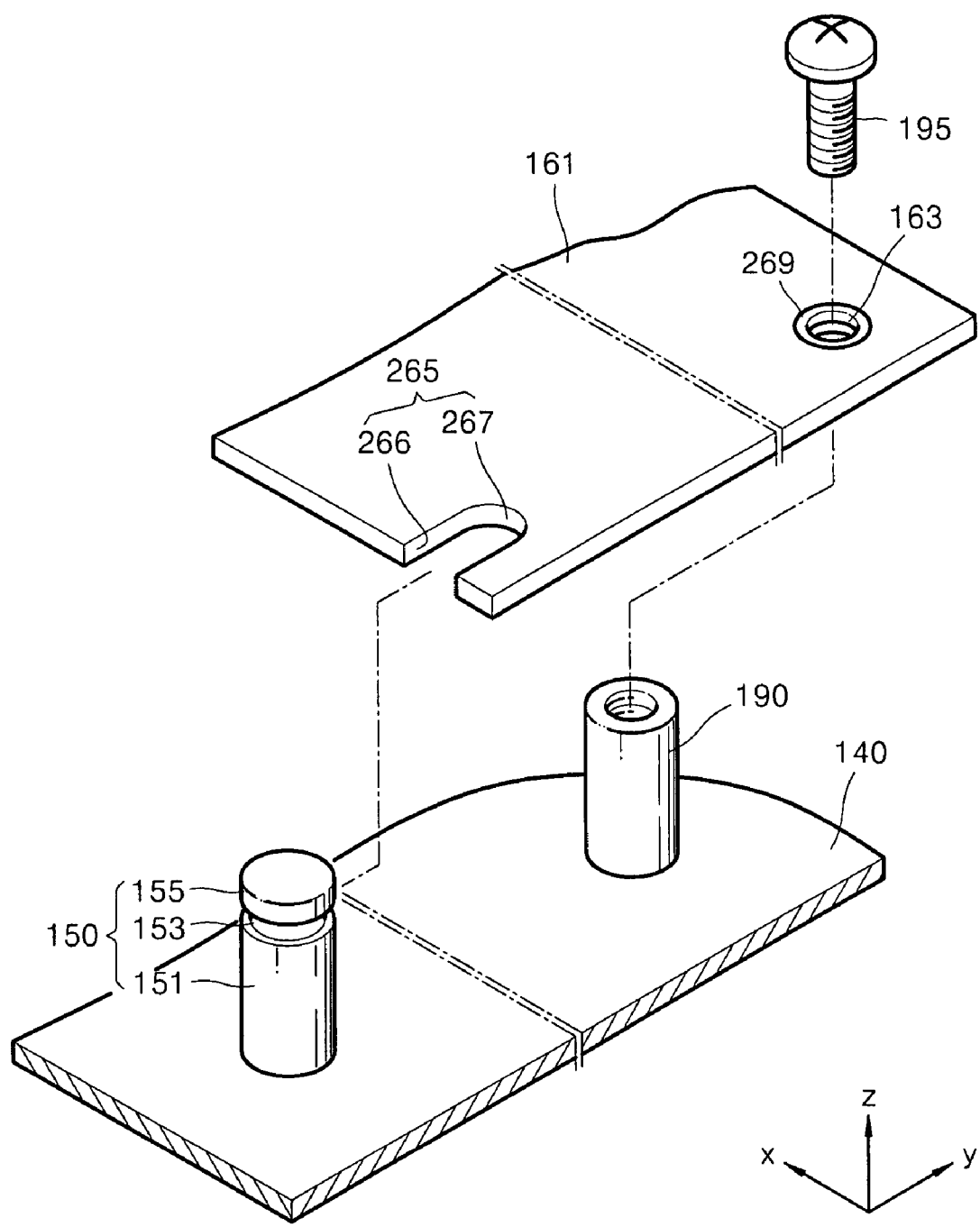
FIG. 5 illustrates an exploded perspective view of part B in FIG. 1.
Figure 6:
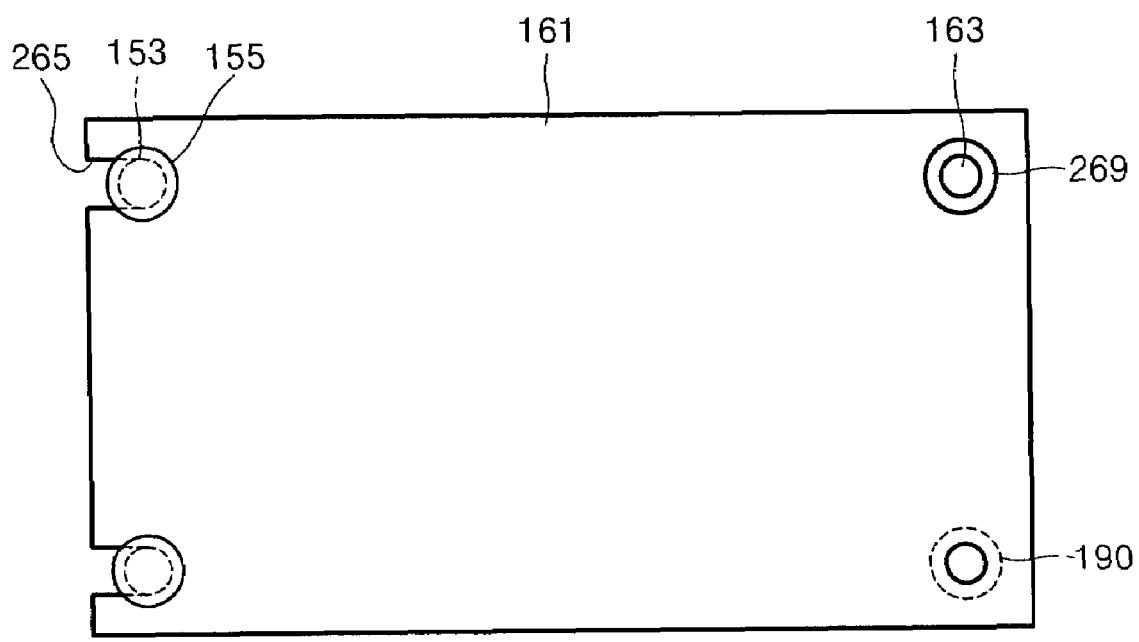
FIG. 6 illustrates a plan view of a circuit board having the fixing structure of FIG. 5.
Figure 6:
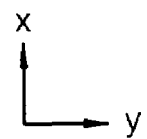

According to another embodiment of the present invention, illustrated in FIGS. 1 and 5-6, a fixing structure may be similar to the fixing structure described previously with respect to FIGS. 1-2, with the exception that a board mounting hole 265 may be formed as a curved-in opening, i.e., a U-shaped structure in the xy-plane and being in communication with an exterior of the circuit board, in the circuit board 161, having a guide hole 266 and an insertion hole 267. The guide hole 266 and the insertion hole 267 of the board mounting hole 265 may be formed sequentially in the xy-plane, such that the guide hole 266 may be formed in communication with an edge of the circuit board 161 and the exterior, and the insertion hole 267 may be formed further from the edge of the circuit board 161, i.e., the guide hole 266 may be positioned between the exterior and the insertion hole 267 with respect to the xy-plane. The insertion hole 267 may have a width, i.e., a distance as measured along the x-axis, substantially equal to or smaller than a width of the guide hole 266.

Accordingly, the circuit board 161 may be slid along the y-axis toward the mounting member 150, such that the insertion portion 153 of the board mounting member 150 may be inserted through the guide hole 266 of the board mounting hole 165 and slid along the y-axis to facilitate securing of the circuit board 161 to the chassis base 140. Such sliding, i.e., a fit of a hole, of the circuit board 161 on the board mounting portion 150 may speed up fixing due to elimination of a need to adjust the board mounting member 155 to the center portion of the board mounting hole 165. When the board mounting member 150 is inserted in the board mounting hole 165, the boss hole 163 formed at an opposite edge of the circuit board 161 may be aligned with the boss 190, thereby facilitating attachment of the circuit board 161 to the chassis base 140 via the boss screw 195.

A grounding terminal 269 may be formed on the boss hole 163 of the circuit board 161, as further illustrated in FIGS. 5-6, to be electrically connected to the chassis base 140 through the boss 190. However, other grounding configurations, e.g., as previously described with respect to FIGS. 1-2, are not excluded from the scope of the present invention.

The present invention is advantageous in providing an improved fixing structure capable of fitting the circuit board 161 on an exact position of the boss 190, thereby eliminating a need for an additional guiding boss or a stepped boss. In addition, since the insertion portion 153 of the board mounting member 150 may be inserted into the insertion hole 167 or 267 to secure the circuit board 161, use of additional fixing units, e.g., a boss screw, may be eliminated or reduced, thereby decreasing overall manufacturing time and costs of the plasma display module and increasing operational efficiency.

According to yet another embodiment of the present invention, illustrated in FIG. 1, a plasma display module 100 may include a structure for fixing a circuit board to a chassis base. In particular, the plasma display apparatus 100 may include a plasma display panel (PDP) 110 having a front panel 120 and a rear panel 130, a chassis base 140 attached to a rear surface of the rear panel 130, and a circuit unit 160 with a plurality of circuit boards 161 coupled to the chassis base 140 via a fixing structure in order to drive the PDP. The fixing structure employed to fix each circuit board 161 to the chassis base 140 may be either type of the fixing structures described previously with respect to FIGS. 1-6 or both. For example, as further illustrated in FIG. 1, some of the circuit boards 161 may be attached via the fixing structure illustrated in FIG. 2, as illustrated in part A of FIG. 1, and some of the circuit boars 161 may be attached via the fixing structure illustrated in FIG. 5, as illustrated in part B of FIG. 1.

The circuit unit 160 may include a plurality of circuit boards 161, e.g., a logic board, a power board, a logic buffer board, and so forth. Accordingly, the circuit unit 160 may transmit electric signals to the PDP 110 through a signal transmission member 170, e.g., a flexible circuit board, such as a tape carrier package (TCP) or a chip on film (COF). The signal transmission member 170 may be formed as a package by mounting at least one mounting device 172 on a wiring portion formed as a tape.

The plasma display module 100 may further include a cover plate 180, a heat dissipation structure (not shown), and an adhesive member (not shown), e.g., a dual-adhesive tape. The cover plate 180 may be positioned on outer portions of the mounting devices 172. The cover plate 180 with a plurality of mounting holes 185 may be coupled to the chassis base 140 by inserting mounting bolts 183 through the mounting holes 185 into installation holes 143 of the chassis base 140.

The heat dissipation structure may include a heat dissipating member, i.e., a thermal conductive medium, between the PDP 110 and the chassis base 140. Additionally, the heat dissipation structure may include use of predetermined materials to facilitate dissipation of heat generated by the circuit board 161 to the chassis base 140 through the board mounting member 150 or the boss 190. In particular, the board mounting member 150 or the boss 190 may be formed of a thermal conductive material, such that the board mounting member 150 or the boss 190 may transmit the heat generated by the circuit board 161 to the chassis base 140.

The fixing structure of the present invention, having the board mounting member 150 and the board mounting hole 165 or 265, may be advantageously employed in a plasma display module. In particular, the fixing structure may facilitate fast and accurate fixing of the circuit boards 161 to the chassis base 140 of the plasma display module, thereby significantly reducing manufacturing time and costs of a plasma display module having a large number of circuit boards 161, e.g., a plasma display module having a large size PDP with high-definition (HD) display capabilities.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A fixing structure for a circuit board, comprising:
   at least one board mounting hole in the circuit board, the board mounting hole having a guide hole and an insertion hole with a support portion; and
   at least one board mounting member inserted through the board mounting hole, the board mounting member having a main body, a cover, and an insertion portion therebetween, wherein the insertion portion has a cross-sectional area smaller than either of the main body or the cover, and has a radius that substantially equals a radius of the support portion of the insertion hole of the board mounting hole.

2. The fixing structure as claimed in claim 1, wherein the board mounting hole includes a grounding terminal.

3. The fixing structure as claimed in claim 1, wherein the guide hole has a cross-sectional area larger than that of the cover of the board mounting member.

4. The fixing structure as claimed in claim 1, wherein a thickness of the insertion portion is substantially equal to a thickness of the circuit board.

5. The fixing structure as claimed in claim 1, further comprising a plurality of board mounting holes.

6. The fixing structure as claimed in claim 5, wherein the plurality of board mounting holes is along one edge of the circuit board.

7. The fixing structure as claimed in claim 6, wherein the board mounting holes are U-shaped from a planar perspective and in communication with an exterior of the circuit board.

8. A plasma display apparatus, comprising:
   a plasma display panel;
   a chassis base attached to a rear surface of the plasma display panel;
   at least one circuit board having at least one board mounting hole, the board mounting hole including an insertion hole and a guide hole;
   at least one board mounting member coupled between the chassis base and the circuit board, the board mounting member having a main body, a cover, and an insertion portion, wherein the insertion portion has a cross-sectional area smaller than a cross-sectional area of either the main body or the cover, and has a radius that substantially equals a radius of a support portion of the insertion hole of the board mounting hole; and
   a circuit unit.

9. The plasma display apparatus as claimed in claim 8, wherein the board mounting hole includes a grounding terminal electrically connected to the chassis base through the board mounting member.

10. The plasma display module as claimed in claim 8, wherein the guide hole has a cross-sectional area larger than that of the cover of the board mounting member.

11. The plasma display apparatus as claimed in claim 8, wherein a thickness of the insertion portion is substantially equal to a thickness of the circuit board.

12. The plasma display apparatus as claimed in claim 8, further comprising at least two board mounting holes along a single edge of the circuit board.

13. The plasma display apparatus as claimed in claim 12, further comprising:
   at least one boss hole in an opposite edge of the circuit board with respect to the board mounting holes;
   at least one boss protruding to a height substantially equal to a height of the main body; and
   at least one boss screw coupled to the boss through the boss hole.

14. A plasma display apparatus, comprising:
   a plasma display panel;
   a chassis base attached to a rear surface of the plasma display panel;
   a circuit unit including a plurality of circuit boards, each circuit board including a plurality of U-shaped board mounting holes and boss holes, each board mounting hole including an insertion hole and a guide hole;
   a plurality of board mounting members, each board mounting member coupled between the chassis base and a circuit board, the board mounting member having a main body, a cover, and an insertion portion, wherein the insertion portion has a cross-sectional area smaller than a cross-sectional area of either the main body or the cover and is capable of fitting in the insertion hole of the board mounting hole;
   a plurality of bosses protruding in the chassis base; and
   a plurality of boss screws coupled to the bosses through the boss holes.

15. The plasma display apparatus as claimed in claim 14, wherein each of the board mounting holes includes a grounding terminal electrically connected to the chassis base through the board mounting member.

16. The plasma display apparatus as claimed in claim 14, wherein a thickness of the insertion portion is substantially equal to a thickness of the circuit board.

17. The plasma display apparatus as claimed in claim 14, wherein the insertion hole has a width substantially equal to or smaller than a width of the guide hole.

18. The plasma display apparatus as claimed in claim 14, wherein the boss protrudes to a height substantially equal to a height of the main body of the board mounting member.

* * * * *